US011269021B2

(12) United States Patent
Ratcliffe et al.

(10) Patent No.: US 11,269,021 B2
(45) Date of Patent: Mar. 8, 2022

(54) MAGNETIC FREEPOINT INDICATOR TOOL

(71) Applicant: Baker Hughes Oilfield Operations LLC, Houston, TX (US)

(72) Inventors: James David Ratcliffe, Farnborough (GB); Andrew Smith, Farnborough (GB); Jim Andrew Gulliver, Farnborough (GB); Sushant Dutta, Sugar Land, TX (US)

(73) Assignee: Baker Hughes Oilfield Operations LLC, Houston, TX (US)

( * ) Notice: Subject to any disclaimer, the term of this patent is extended or adjusted under 35 U.S.C. 154(b) by 30 days.

(21) Appl. No.: 16/910,935

(22) Filed: Jun. 24, 2020

(65) Prior Publication Data

US 2021/0341552 A1    Nov. 4, 2021

Related U.S. Application Data

(63) Continuation of application No. 16/861,858, filed on Apr. 29, 2020.

(51) Int. Cl.
*G01R 33/04* (2006.01)
*G01R 33/00* (2006.01)
*G01R 33/038* (2006.01)
*G01R 33/07* (2006.01)
(Continued)

(52) U.S. Cl.
CPC ........ *G01R 33/0011* (2013.01); *E21B 47/092* (2020.05); *G01R 33/038* (2013.01); *G01R 33/0354* (2013.01); *G01R 33/04* (2013.01); *G01R 33/07* (2013.01)

(58) Field of Classification Search
CPC .......................... G01R 33/00; G01R 33/0035; G01R 33/0023; G01R 33/0017; G01R 31/3191; G01R 33/0011; G01R 33/0354; G01R 33/038; G01R 33/04; G01R 33/07;
(Continued)

(56) References Cited

U.S. PATENT DOCUMENTS 5,258,755 A * 11/1993 Kuckes ............... E21B 47/0228
340/853.5
2004/0196032 A1   10/2004 Newman
2006/0150727 A1    7/2006 Estes
(Continued)

FOREIGN PATENT DOCUMENTS

CN      101517191    8/2009
WO      2015003783   1/2015

OTHER PUBLICATIONS

International Search Report and Written Opinion dated Sep. 23, 2021 in corresponding PCT Application No. PCT/US2021/029646.
(Continued)

*Primary Examiner* — Jermele M Hollington
*Assistant Examiner* — Taqi R Nasir
(74) *Attorney, Agent, or Firm* — Hogan Lovells US LLP

(57) ABSTRACT

A system for determining a stuck point of a pipe positioned within a wellbore includes a tubular housing and a sensor array positioned within the tubular housing. The system also includes ferromagnetic flux collectors and flux concentrators on either side of the sensor array. The flux collectors collect a magnetic flux that has been written to a portion of pipe. The flux concentrators intensify the flux to improve measurements of the flux that are acquired by the sensor array.

21 Claims, 5 Drawing Sheets

(51) Int. Cl.
*E21B 47/092* (2012.01)
*G01R 33/035* (2006.01)

(58) Field of Classification Search
CPC ......... G01B 7/004; G01C 17/38; G06F 3/017; G06F 3/0346; G06F 3/012; E21B 47/092
See application file for complete search history.

(56) References Cited

U.S. PATENT DOCUMENTS

| | | | |
|---|---|---|---|
| 2009/0166035 A1* | 7/2009 | Almaguer | E21B 29/00 166/254.1 |
| 2010/0017134 A1* | 1/2010 | Steinman | E21B 43/04 702/8 |
| 2017/0314387 A1 | 11/2017 | Yang | |
| 2021/0199837 A1 | 7/2021 | Gulliver | |

OTHER PUBLICATIONS

Office Action dated Sep. 30, 2021 in corresponding U.S. Appl. No. 16/861,858.

* cited by examiner

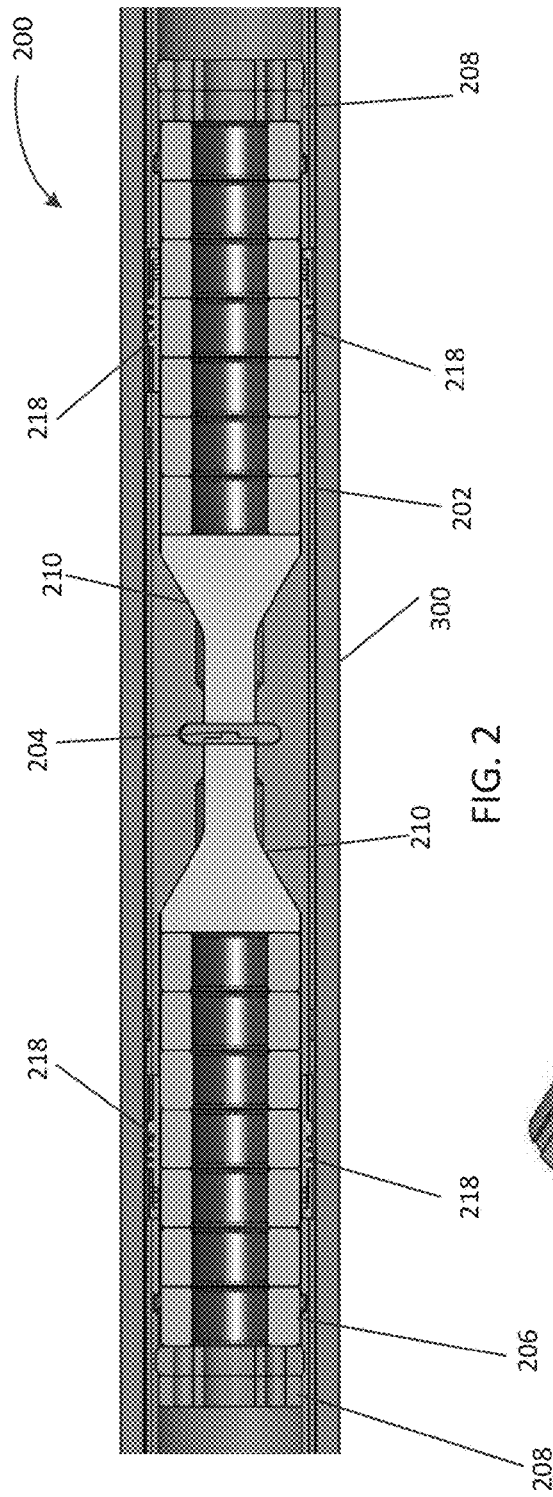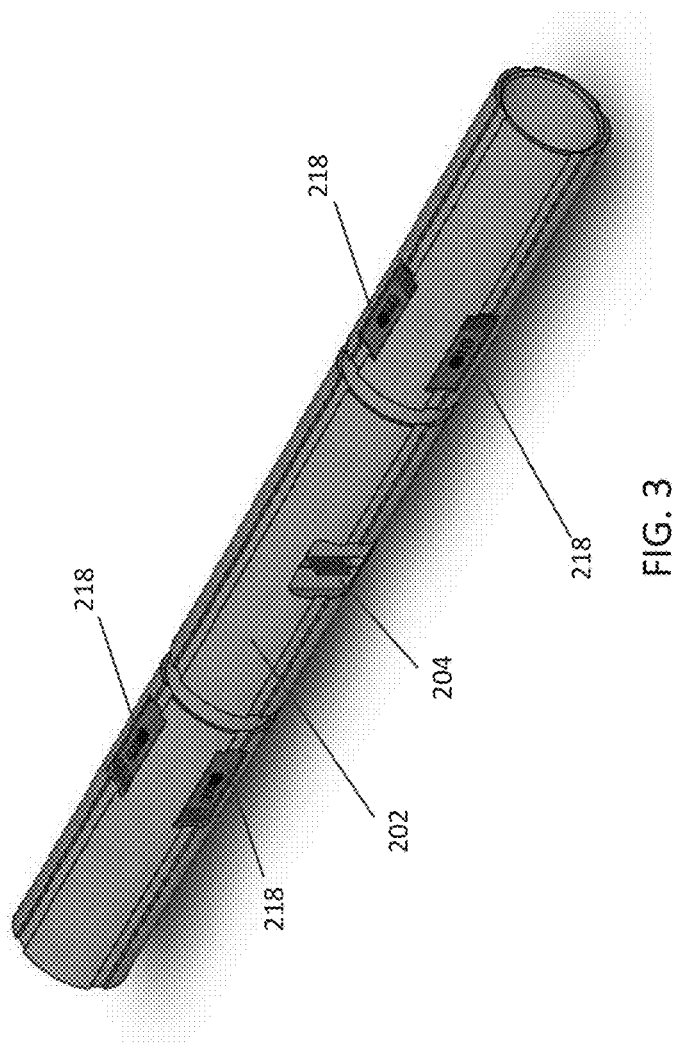

MAGNETIC FREEPOINT INDICATOR TOOL

CROSS REFERENCE TO RELATED APPLICATIONS

This application is a continuation of U.S. patent application Ser. No. 16/861,858, filed Apr. 29, 2020, the full disclosure of which is hereby incorporated by reference herein for all purposes.

BACKGROUND OF THE DISCLOSURE

1. Field of the Disclosure

The present disclosure relates in general to downhole tools and more particularly to downhole tools utilized to assist with drilling operations.

2. Brief Description of Related Art

During downhole drilling and recovery operations, portions of a drill string may become stuck. For example, while wells are being drilled undesirable events, such as hole collapse, differential stick, key seating, and the like may cause the drill string to become stuck within the formation. This situation is undesirable and may hinder drilling operations. In addition, drill pipe may represent a significant investment, and as a result, recovering at least a portion of the drill pipe may be desirable. However, it is difficult to determine where the sticking point has occurred. As a result, operators either conduct several runs to determine the sticking point, which is not cost effective, or leave large portions of the pipe in the formation.

SUMMARY OF THE DISCLOSURE

Applicants recognized the problems noted above herein and conceived and developed embodiments of systems and methods, according to the present disclosure, for downhole identification.

In an embodiment, a method for determining a stuck point of a pipe is described. The method includes writing a first magnetic profile along a first portion of pipe and measuring a magnetic flux of the pipe. The magnetic profile may be written to the pipe by applying a plurality of magnetic pulses to the pipe. A force is applied to the pipe and the magnetic flux is remeasured. Based on the difference between the measured fluxes, the stuck point of the pipe may be determined. In some embodiments, if the change in flux does not meet a threshold, the flux of a new portion of the pipe may be measured.

In another embodiment, a system is described that includes one or more magnetic sources that pulse a magnetic field onto a pipe, and one or more sensors to measure the magnetic flux. In some embodiments, the system may further include a drilling rig and a component to apply one or more forces to a stuck pipe. The system includes the sensors and magnetic source in a magnetic free point indicator tool, which may be lowered into the pipe to determine where a stuck point exists.

In another embodiment, a system is described that includes a sensor array arranged between two flux concentrators, which are situated between two ferromagnetic flux collectors. The flux collectors collect the magnetic flux that has been written to a pipe, and the flux concentrators intensify the flux to improve measurements of the flux that are taken by the sensor array. In some embodiments, the system is part of an MFIT, which also includes one or more transmitters that write a magnetic profile to sections of the pipe. The flux collectors then collect the flux and the sensor measures the flux. In some embodiments, the flux may be measured before and during a time when a force is applied to the pipe. Based on changes in the flux, a stuck point of the pipe may be determined.

BRIEF DESCRIPTION OF THE DRAWINGS

The present technology will be better understood on reading the following detailed description of non-limiting embodiments thereof, and on examining the accompanying drawings, in which:

FIG. 2 is a schematic cross-sectional view of an embodiment of a magnetic freepoint indicator tool (MFIT), in accordance with embodiments of the present disclosure;

FIG. 3 is a schematic view of the exterior of the tubular housing of an MFIT, in accordance with embodiments of the present disclosure;

DETAILED DESCRIPTION OF THE PREFERRED EMBODIMENT

Figure 1:
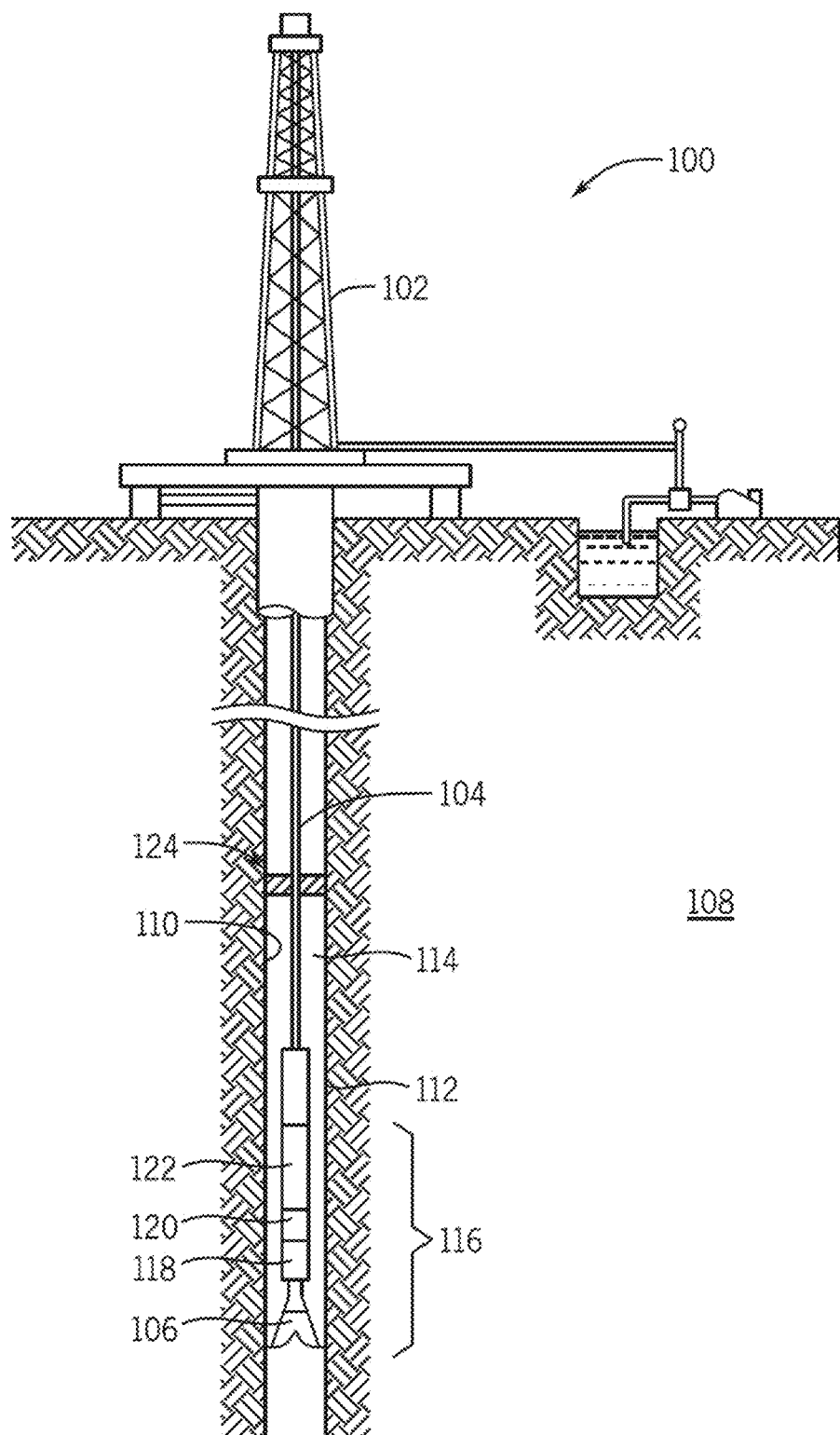
FIG. 1 is a schematic side view of an embodiment of a drilling system, in accordance with embodiments of the present disclosure.

The foregoing aspects, features and advantages of the present technology will be further appreciated when considered with reference to the following description of preferred embodiments and accompanying drawings, wherein like reference numerals represent like elements. In describing the preferred embodiments of the technology illustrated in the appended drawings, specific terminology will be used for the sake of clarity. The present technology, however, is not intended to be limited to the specific terms used, and it is to be understood that each specific term includes equivalents that operate in a similar manner to accomplish a similar purpose.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements. Any examples of operating parameters and/or environmental conditions are not exclusive of other parameters/conditions of the disclosed embodiments. Additionally, it should be understood that references to "one embodiment", "an embodiment", "certain embodiments," or "other embodiments" of the present invention are not intended to be interpreted as excluding the existence of additional embodiments that also incorporate the recited features. Furthermore, reference to terms such as "above," "below," "upper", "lower", "side", "front," "back," or other terms regarding orientation are made with reference to the illustrated embodiments and are not intended to be limiting or exclude other orientations. Furthermore, like reference numbers may be used between figures to illustrate like components, but it should be appreciated that embodiments are not limited to utilizing like components.

Embodiments of the present disclosure include a magnetic freepoint indicator tool (MFIT) that may be tripped into and out of a wellbore to identify a stuck point of a pipe positioned within the wellbore. In various embodiments, the MFIT includes one or more magnetizing elements, such as a permanent magnet and/or a pulsed coil, to write a magnetic flux onto the pipe (e.g., magnetize the pipe). Thereafter, one or more sensors may evaluate the magnetic flux of the pipe at a given location. The MFIT may then evaluate a change in magnetic flux, to a portion of the pipe, after a force is applied to the pipe. By the process of magnetorestriction, a force applied to a free portion of the pipe may have a changed magnetic flux, as compared to a fixed or stuck portion of the pipe. As a result, a comparison between the magnetic flux of the pipe before and after the force application may enable identification of the stuck point.

FIG. 1 is a schematic side view of an embodiment of a downhole drilling system 100 (e.g., drilling system) that includes a rig 102 and a drill string 104 coupled to the rig 102. The drill string 104 includes a drill bit 106 at a distal end that may be rotated to engage a formation 108 and form a wellbore 110. In various embodiments, the drill string 104 is formed from one or more tubulars that are mechanically coupled together (e.g., via threads, specialty couplings, or the like). As shown, the wellbore 110 includes a borehole sidewall 112 (e.g., sidewall) and an annulus 114 between the wellbore 110 and the drill string 104. Moreover, a bottom hole assembly (BHA) 116 is positioned at the bottom of the wellbore 110. The BHA 116 may include a drill collar 118, stabilizers 120, or the like. It should be appreciated that the BHA 116 is provided for illustrative purposes only and that various other components may be coupled to the drill string 104.

In operation, drilling mud or drilling fluid is pumped through the drill string 104 and out of the drill bit 106. The drilling mud flows into the annulus 114 and removes cuttings from the face of the drill bit 106. Moreover, the drilling mud may cool the drill bit 106 during drilling operations and further provide pressure stabilization in the wellbore 110. In the illustrated embodiment, the drilling system 100 includes various tools 122, such as logging tools, which may be utilized to obtain measurements from the formation 108. These tools may be referred to as "logging while drilling" tools and may include nuclear tools, acoustic tools, seismic tools, magnetic tools, electrical tools, and the like. Furthermore, while the illustrated embodiment includes the drill string 104, it should be appreciated that various embodiments of the present disclosure may be incorporated into a wireline system, a coiled tubing system, or any other downhole investigation system.

FIG. 1 further illustrates a stuck point location 124. The stuck point location 124 is a location where the drill string 104 and/or any other pipe utilized in the system (e.g., production piping, casing, etc.) is stuck. Stuck refers to piping that cannot be withdrawn from the wellbore 110 to the surface without intervention or significant forces. In other words, stuck piping may not be able to be tripped in/out of the wellbore without intervention, such as applying additional force, which may be undesirable. Embodiments of the present disclosure may utilize a tool, such as a magnetic freepoint indicator tool (MFIT) to locate the stuck point location 124, based at least in part on an evaluation of magnetic properties in the pipe. For example, the MFIT may be utilized to determine a stuck point within the wellbore, where one or more components, such as drill pipe, has become lodged within the wellbore.

In some embodiments, a combination of an electromagnetic coil as well as a permanent magnet may be included. For example, the permanent magnet may be positioned within the MFIT in one direction with the electromagnetic coil positioned in the opposite direction. Thus, generated pulses may be maximized without saturating the magnetic signature.

In embodiments, the MFIT combines ferromagnetic collectors and flux concentrators to aid in identifying a stuck point. As a result, the MFIT may include one or more magnetic sources and one or more sensors to measure the residual pulse amplitude, among other measurements. Furthermore, additional components may also be utilized in combination with the MFIT. For example, in operation, an uphole component such as a table or top drive may be utilized in order to apply a force to the drill pipe (e.g., a linear force, a rotational force, etc.). Thereafter, a change in the magnetic properties of a pipe region that experiences strain (the free end) may be measured, while regions that do not experience strain (e.g., regions below the stuck point) will not have a change in magnetic properties. As a result, a measurement of a remnant magnetic field, after magnetization of the pipe, may be utilized to determine the stuck point. In this manner, the stuck region may be identified and pipe upstream may be removed (e.g., unthreaded, cut, etc.) from the wellbore to enable operations to continue while saving the pipe.

Traditional systems may include a tool consisting of a load cell and two anchors or clamps, which are run into the pipe and anchored into place. Then the pipe is pulled or twisted. If the load cell measures a change in strain, the tool is located above the stuck point. If it measures no change to strain, it is located below the stuck point. By continuing this process along the length of pipe, the stuck point may eventually be found. However, this process is slow, which can be costly for producers. A variety of other tools may be utilized, each having various drawbacks. For example, pipe stretching evaluations are often inaccurate. Additionally, anchor tools are slow and do not lend themselves to a continuous logging process. Sonic tools typically have signal/noise problems. Permeability measurements often have difficulties due to currents and low amplitudes.

Accordingly, embodiments of the present disclosure are directed toward a magnetic tool that determines the stuck point location 126 utilizing ferromagnetic collectors (e.g., ferromagnetic cylinders, cylindrical rings) and flux concentrators. For example, in one embodiment, a sensor is arranged between two flux concentrators. Each of the flux concentrators intensify magnetic flux that is detected by one or more ferromagnetic collectors, such as ferromagnetic rings, that are arranged at the opposite ends of the flux concentrators. Thus, changes in the axial flux may be measured more accurately by the sensor, which measures the intensified flux.

In various embodiments, the MFIT is deployed when pipe is stuck, for example during a drilling operation. In various embodiments, as noted above, the MFIT includes two or more ferromagnetic flux collectors, flux concentrators, and at least one sensor between the inner ends of the flux collectors. On the down pass (e.g., tripping into the wellbore), the MFIT magnetizes the drill pipe. Sensors located above the magnet measure and/or log the baseline remote field from the flux generated in the pipe. Next, the pipe is overpulled and/or torqued. For example, the drilling rig may be used to apply a torsional or axial force to the pipe. The remote field from the remaining flux is logged again on the up pass (e.g., tripping out of the wellbore). As will be appreciated, the sensors may lead the magnet on the up pass. Comparisons of the logs show where stress has erased (e.g., reduced) the flux due to magnetostrictive effect.

Other embodiments of the present disclosure may enable an increase in flux that may be applied to a pipe, thus allowing for improved measurements of the flux profile that has been applied to the pipe. On the down pass of the MFIT, pulses from one or more electromagnets of the MFIT produce a flux signature or profile on the pipe. Further, magnetic flux may be applied with one or more permanent magnets that apply the magnetic flux while passing along the pipe. By pulsing the magnetic force as opposed to just applying a single magnetic force, the flux profile of the pipe may be increased without causing other portions of the MFIT to become saturated with flux. On the up pass of the MFIT, the flux profile, now stronger than if the flux were applied by a single magnetic force, may be measured by one or more sensors of the MFIT. With a combination of one or more permanent magnets and an electromagnetic coil, the pulse height may be maximized to improve resolution in reading the flux difference.

FIG. 2 is a schematic cross-sectional view of an embodiment of an MFIT 200 arranged in a pipe 300. The illustrated embodiment includes a housing 202, which may be a tubular designed to withstand expected wellbore pressures and temperatures. The housing 202 includes various electronics, which may include processors, memories, and communication modules to facilitate receipt and/or transmission of instructions and/or data. For example, instructions may be received from a surface location, such as to begin pulsing the coil. Additionally, in embodiments, collected data may be transmitted to a surface location. However, it should be appreciated that instructions and data may both be stored at onboard memory or memory that is coupled to the device for recording purposes.

Further illustrated is a primary sensor array 204 at a central location of the tubular housing 202. The sensor array 204 may further include associated electronics. In various embodiments, the sensor array 204 includes a plurality of sensors. Additionally, in one embodiment, additional radial sensor arrays 218 are arranged circumferentially about the housing 202. As illustrated and further exemplified in FIG. 3, 8 radial sensor arrays 218 are arranged on the housing 202 (an additional 4 radial sensor arrays are positioned opposite the shown radial sensor arrays 218 which are present but not shown in FIG. 3). However, it is contemplated that the additional sensors 218 may be arranged in other configurations, including an MFIT with no additional sensors. By way of example only, the central sensor array 204 and/or additional radial sensor arrays 218 may include anisotropic magneto-resistive (AMR) sensors. However, it should be appreciated that a variety of different magnetometers with varying compositions and properties may be used with embodiments of the present disclosure, such as Hall effect sensors, magneto-diodes, magneto-transistors, GMR magnetometers, superconducting quantum interference devices (SQUIDs), flux-gates, sensing coils, or a combination thereof.

Additionally, transmitters 208 are arranged at ends of the MFIT 200, one of which may be a downhole end of the tool (i.e., inserted into the wellbore first) and a uphole end of the tool. As noted above, the initial run includes applying a baseline magnetic field to the pipe 300, which is collected by the ferromagnetic collectors 206 and intensified by the flux concentrators 210, and recording that field via the sensor array 204. Then, as the tool is removed from the wellbore, the sensor array 204 measures changes in the magnetic retentivity, also collected by the ferromagnetic collectors 206 and intensified by the flux concentrators. In the illustrated embodiment, the sensor array 204 is offset from the transmitter 208 by an offset distance 212, which may be particularly selected based on a strength of the transmitter, a length of the tool, or the like. As will be appreciated, if the sensor array 204 is too close to the transmitter 208, then the sensor array 204 may pick up magnetic data from the transmitter 208 and not the pipe 300.

When a drill pipe becomes stuck or otherwise immobile in the wellbore, the MFIT 200 may be tripped into the wellbore (e.g., lowered into the wellbore) in order to magnetize the pipe 300. In various embodiments, the transmitter 208 may include both a permanent magnet and/or an electromagnetic coil 216 wrapped around a core. As the transmitter 208 extends into the wellbore, the electromagnetic coil is activated, which may produce "bands" of magnetized material in the drill pipe 300 as well as flux applied by a permanent magnet. In various embodiments, these bands are produced approximately every 1 or 2 feet, and as a result, the tool may write hundreds or thousands of pulses within the wellbore. As a result, there is both an axial flux and a radial flux. As a result, a patterned flux may be applied to the pipe 300, which may be detected by the sensor array.

The pulsed magnetizing field may generate a flux connected in thin skin, close to the bore of the pipe 300. In some embodiments, an electromagnetic coil may be pulsed a plurality of times to write a flux pattern on the pipe 300. This may occur in conjunction with flux written to the pipe by one or more permanent magnets. Without doing so, the written flux profile is more dilute, particularly with thick-walled collars. As a result, the flux density when rapidly pulsing the magnet coil multiple times may be much higher than from applying a single pulse at a location on the pipe 300.

Figure 4:
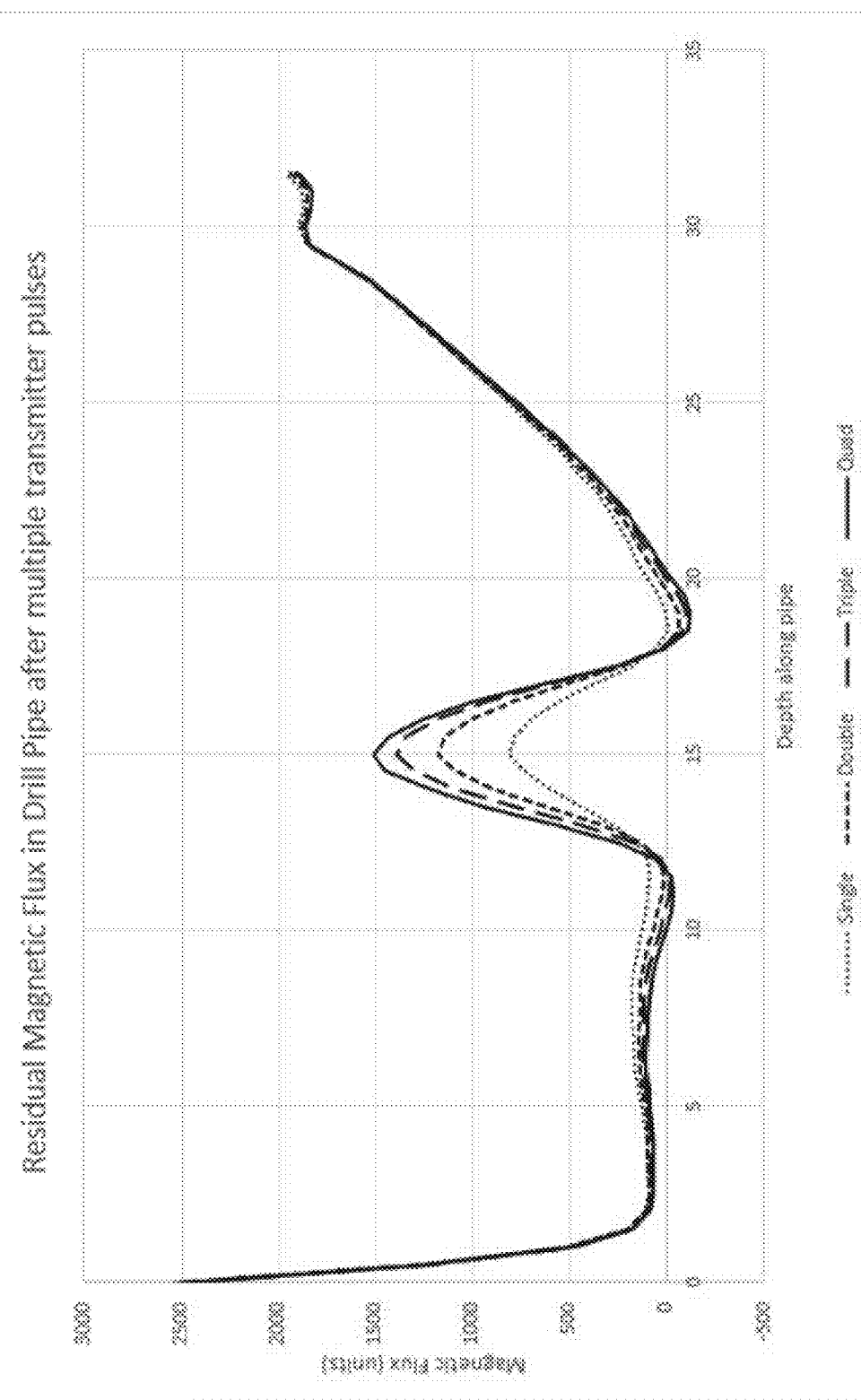
FIG. 4 is a graph that illustrates the residual flux that is left on a pipe after pulsing the pipe a plurality of times by a magnetic source.

FIG. 4 is a graph of residual magnetic flux after pulsing a pipe with a plurality of transmitter pulses. As illustrated, the graph includes lines representing a single pulse, two pulses, three pulses, and four pulses. When a single pulse is written to a pipe, the residual magnetic force is approximately 750 units at a depth of 15. However, as more pulses are utilized in writing a magnetic signature to a pipe, the residual flux increases, thus allowing for more accurate measurements of the flux when the profile is later checked. Thus, using the method described herein, applying a plurality of pulses improves the process of determining a stuck point in a pipe.

Figure 5:
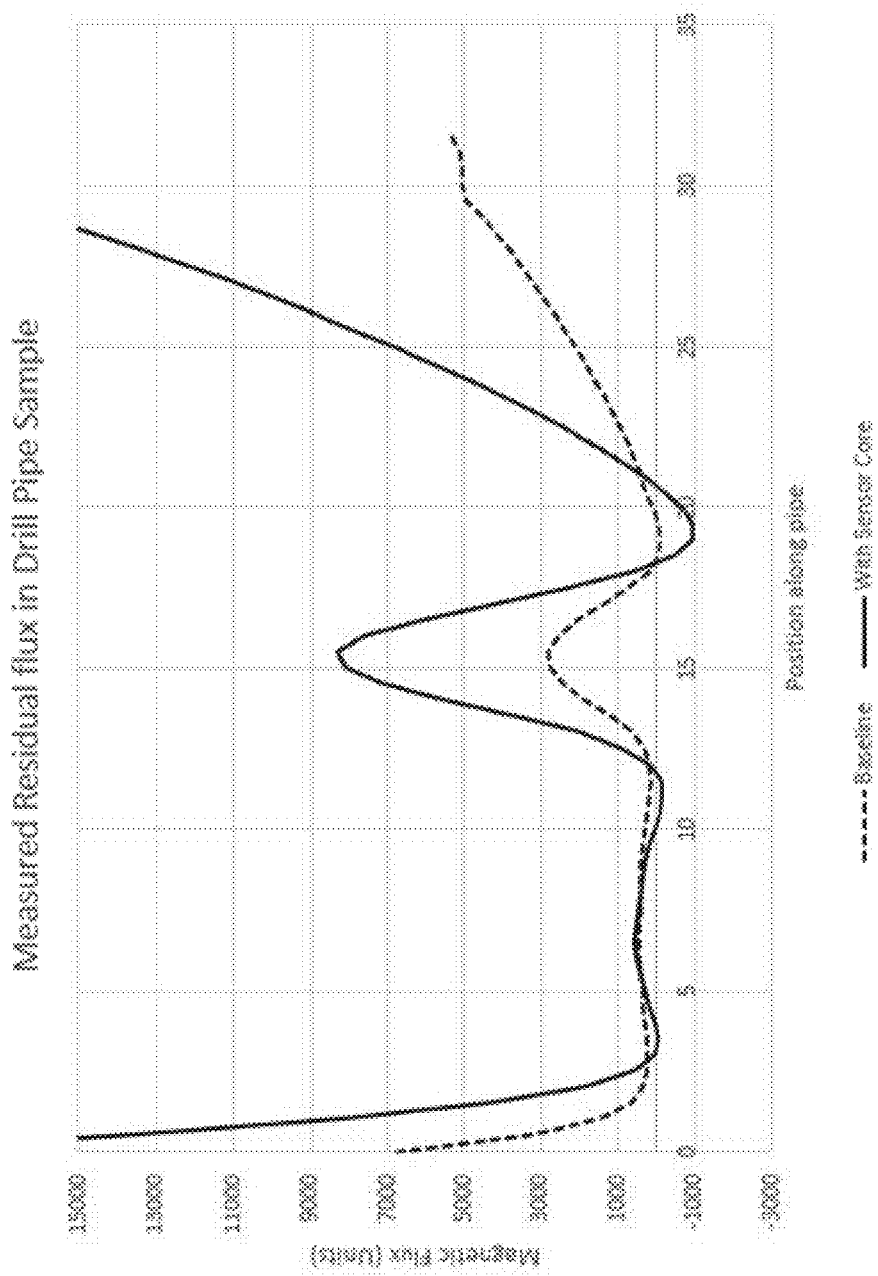
FIG. 5 is a graph that illustrates residual flux that is measured with and without an embodiment described herein.

FIG. 5 is a graph that illustrates measured residual flux in a pipe. The graph includes a baseline measurement (i.e., measurements with a "standard" MFIT that does not include embodiments described herein) and measurements taken by an MFIT that includes the flux concentrators as described herein. As illustrated, the baseline measurement of flux at 15 units is approximately 3,000. However, by implementing the MFIT with ferromagnetic collectors, flux concentrators, and a central sensor array, the same measurement position results in approximately 8,000 units of flux. Thus, because the measured flux is substantially higher when the concentrator configuration is utilized, greater accuracy and improved resolution of measurements can be achieved using the same type of sensor array.

Figure 6:
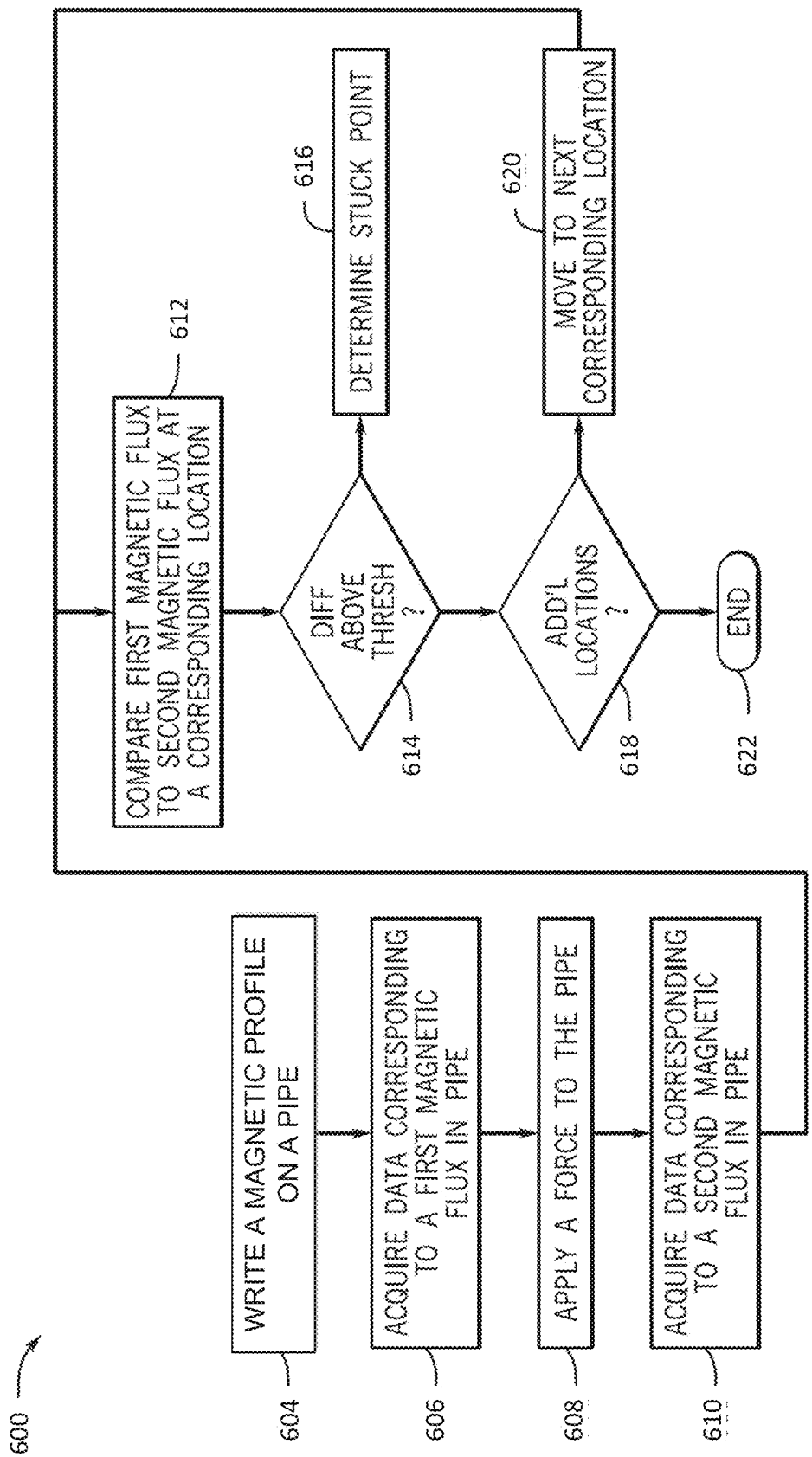
FIG. 6 is a flow chart of an embodiment of a method for determining a stuck point, in accordance with embodiments of the present disclosure.

FIG. 6 is a flow chart of an embodiment of a method 600 for determining a stuck point in a wellbore, for example a stuck point of pipe positioned within the wellbore. It should be appreciated that for this method, and other methods described herein, that the claims may be performed in a different order, or in parallel, unless otherwise explicitly stated. Moreover, there may be more or fewer steps and certain steps of the method may be optional. During a drilling operation, a pipe may become stuck in a wellbore, as noted above. It may be desirable to retrieve at least a portion of the piping downhole, as the pipe may be costly for operators. During recovery operations, the pipe may be cut or unthreaded at a location uphole of a stuck point, thereby allowing the unstuck portions to be freely removed. However, it may be difficult to identify the stuck point. Embodiments of the present disclosure may utilize the MFIT to position a tool within the pipe to identify the stuck point. The tool may be run into the pipe (e.g., lowered downhole into the pipe) to write a magnetic profile on the pipe 904. The magnetic profile may be from an electromagnet that is incorporated into the MFIT. In various embodiments, the magnetic profile may be written to the pipe by pulsing the electromagnet a plurality of times to increase the intensity of the resulting profile.

In various embodiments, data is acquired that corresponds to a first magnetic flux of the pipe 906. The first magnetic flux may be associated with the magnetic flux generated by the magnetic profile. As described, data may be acquired via downhole sensors incorporated into the MFIT. In various embodiments, the data acquisition includes a profile that illustrates the first magnetic flux as a function of a location along an axial length of the pipe. That is, one or more position sensors may be incorporated in order to determine a location of different magnetic flux measurements. In some embodiments, the acquired data may be measured by a sensor array and a configuration with flux concentrators, as described herein.

As noted above, magneto-restriction may enable the MFIT to identify the stuck point by comparing how magnetic flux changes in areas of the pipe in response to an applied force. In some embodiments, the magnetic flux may be measured while the force is applied to the pipe. Alternatively, the magnetic force may be measure after the force has been applied to the pipe. Accordingly, the method may also include applying a force to the pipe 908 and alternatively, apply and ceasing applying force to the pipe. This force may be an axial force (e.g., a pull or push), a radial force, a torsional force (e.g., a twist), or a combination thereof. Next, a second data acquisition process may correspond to a second magnetic flux in the pipe 910. The second magnetic flux may correspond to a change resulting from the applied force. In other words, the second magnetic flux may be referred to as the magnetic flux measured after the application of the force. For example, as noted above, the area of the pipe above the stuck point is anticipated as having a reduced magnetic flux due to magnetorestriction while the area below the stuck point is anticipated as having the same or substantially same magnetic flux. The second data acquisition event includes tripping the MFIT out of the pipe/wellbore such that the sensor array is first, with respect to the magnetic sources. As a result, the permanent magnetic will not re-magnetize or modify the readings, and moreover, the pulsed coil may be shut off during the second data acquisition event. The second data acquisition event, like the first data acquisition event, may also correlate the magnetic flux to the wellbore position, thereby enabling comparison with the first magnetic flux.

In various embodiments, the first and second magnetic fluxes are compared at a corresponding location 912. For example, each magnetic flux may be evaluated at an equal or substantially equal location within the pipe. The comparison may evaluate a difference or change in the magnetic flux, for example, against a threshold 914. If the difference exceeds the threshold, the stuck point may be determined 916. However, if the difference does not exceed the threshold, additional data may be considered 918. If there is additional data 920, those corresponding points may be reevaluated against the threshold. If there is no additional data, the method may end 922. In this manner, various positions along a length of the pipe may be evaluated to determine the stuck point.

Although the technology herein has been described with reference to particular embodiments, it is to be understood that these embodiments are merely illustrative of the principles and applications of the present technology. It is therefore to be understood that numerous modifications may be made to the illustrative embodiments and that other arrangements may be devised without departing from the spirit and scope of the present technology as defined by the appended claims.

What is claimed is:

1. A system for determining a stuck point of a pipe positioned within a wellbore, comprising:
   a tubular housing having a first end and a second end;
   a first ferromagnetic collector positioned within the tubular housing at a first end and having an outer profile shape on its ends;
   a second ferromagnetic collector positioned within the tubular housing at a second end and having the outer profile shape on its ends;
   a first flux concentrator positioned between the first ferromagnetic collector and the second ferromagnetic collector, and having an outer end of the profile shape and adjacent to the first ferromagnetic collector, and having an inner end of an inner profile shape, the inner profile shape smaller than the outer profile shape;
   a second ferromagnetic concentrator positioned between the second ferromagnetic collector and the first flux concentrator having an outer end of the outer profile shape and adjacent to the second ferromagnetic collector, and an inner end of the inner profile shape; and
   a sensor array positioned axially to the tubular housing and between the first flux concentrator and the second flux concentrator, wherein the sensor array is smaller than the inner profile shape;
   wherein the first ferromagnetic collector and the second ferromagnetic collector attract a magnetic field, wherein the first flux concentrator and the second flux concentrator concentrate the magnetic field, and wherein the sensor array measures the concentrated magnetic field.

2. The system of claim 1, wherein the sensor array measures a first concentrated magnetic field when the tubular housing is located at a portion of the pipe; and wherein the sensor array measures a second concentrated magnetic force at the portion of the pipe when a force is applied to the pipe.

3. The system of claim 2, wherein a difference between the first concentrated magnetic force and the second concentrated magnetic force exceeding a threshold is indicative of the tubular housing being above the stuck point.

4. The system of claim 1, further comprising:
   one or more magnet sources, wherein the magnetic sources apply the magnetic field to a pipe.

5. The system of claim 4, wherein each of the one or more magnet sources are at least one of permanent and electromagnetic.

6. The system of claim 1, further comprising:

one or more additional sensors positioned radially on the tubular housing.

7. The system of claim 1, wherein the outer profile shape is circular.

8. The system of claim 7, wherein at least one of the first ferromagnetic collector and the second ferromagnetic collector are one of a ferromagnetic ring and a solid ferromagnetic cylinder.

9. The system of claim 1, wherein the sensor array includes at least one of anisotropic magneto-resistive sensors, Hall effect sensors, magneto-diodes, magneto-transistors, GMR magnetometers, superconducting quantum interference devices (SQUIDs), flux-gates, sensing coils, Tunneling Magnetoresistive (TMR) sensors, or a combination thereof.

10. A system, comprising:
a drilling rig, the drilling rig installing one or more sections of pipe into a wellbore formed in a downhole formation;
a stuck section of pipe, of the one or more sections of pipe, the stuck section of pipe being positioned in the wellbore and having a free end, a stuck end, and a stuck point between the free end and the stuck end; and
a magnetic freepoint indicator tool (MFIT), comprising:
a first ferromagnetic collector positioned within the MFIT at a first end and having an outer profile shape on its ends;
a second ferromagnetic collector positioned within the MFIT at a second end and having the outer profile shape on its ends;
a first flux concentrator positioned between the first ferromagnetic collector and the second ferromagnetic collector, and having an outer end of the profile shape and adjacent to the first ferromagnetic collector, and having an inner end of an inner profile shape, the inner profile shape smaller than the outer profile shape;
a second ferromagnetic concentrator positioned between the second ferromagnetic collector and the first flux concentrator having an outer end of the outer profile shape and adjacent to the second ferromagnetic collector, and an inner end of the inner profile shape; and
a sensor array positioned axially to the MFIT and between the first flux concentrator and the second flux concentrator, wherein the sensor array is smaller than the inner profile shape;
wherein the first ferromagnetic collector and the second ferromagnetic collector attract a magnetic field, wherein the first flux concentrator and the second flux concentrator concentrate the magnetic field, and wherein the sensor array measures the concentrated magnetic field to identify the stuck point.

11. The system of claim 10, wherein the sensor array measures the magnetic field at a first time and a second time, and wherein a difference between the first measured magnetic field and the second magnetic field are utilized to identify the stuck point.

12. The system of claim 11, wherein a force is applied to the pipe after the first time.

13. The system of claim 10, further comprising one or more additional sensors positioned radially on the MFIT.

14. The system of claim 13, wherein the one or more additional sensor arrays measure radial signatures when force is applied to the stuck pipe.

15. The system of claim 10, wherein the sensor array measures axial signatures.

16. The system of claim 10, further comprising one or more magnetic sources to write a magnetic signature to the stuck pipe.

17. The system of claim 16, wherein the magnetic signatures are written to the pipe by pulsing the magnetic source.

18. A method for identifying a stuck point of a pipe arranged in a wellbore, comprising:
acquiring a first magnetic flux by a sensor array, the sensor array positioned between two flux concentrators, wherein the two flux concentrators are positioned between two ferromagnetic collectors;
acquiring a second magnetic flux by the sensor array; and
determining a difference between the first magnetic flux and the second magnetic.

19. The method of claim 18, further comprising:
applying a force to the pipe while the second magnetic flux is measured.

20. The method of claim 18, further comprising:
applying a force after the second magnetic flux is measured and before the second magnetic flux is measured.

21. The method of claim 18, further comprising:
writing a magnetic signature to the pipe by one or more magnet sources, wherein the first magnetic flux and the second magnetic flux are generated by the magnetic signature.

* * * * *